United States Patent
Kim et al.

(10) Patent No.: US 9,448,580 B2
(45) Date of Patent: Sep. 20, 2016

(54) METHODS AND APPARATUS FOR GENERATING CLOCK SIGNALS BASED ON DUTY CODE AND PERIOD CODE

(71) Applicant: Samsung Electronics Co., Ltd., Suwon-si (KR)

(72) Inventors: Je Kook Kim, Yongin-si (KR); Sang Yong Park, Suwon-si (KR); Chan Woo Park, Anyang-si (KR); Young Hoon Lee, Seoul (KR); Byeong Ha Park, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 214 days.

(21) Appl. No.: 14/154,731

(22) Filed: Jan. 14, 2014

(65) Prior Publication Data

US 2014/0211897 A1  Jul. 31, 2014

(30) Foreign Application Priority Data

Jan. 25, 2013  (KR) .......... 10-2013-0008895

(51) Int. Cl.
| | | |
|---|---|---|
| G06F 1/04 | (2006.01) | |
| G06F 1/08 | (2006.01) | |
| H04L 7/04 | (2006.01) | |
| H03K 5/156 | (2006.01) | |

(52) U.S. Cl.
CPC . *G06F 1/04* (2013.01); *G06F 1/08* (2013.01); *H03K 5/1565* (2013.01); *H04L 7/04* (2013.01)

(58) Field of Classification Search
CPC .................................. G06F 1/04; G06F 1/08
USPC .................................................. 713/500, 600
See application file for complete search history.

(56) References Cited

U.S. PATENT DOCUMENTS

| | | |
|---|---|---|
| 6,424,185 B1 | 7/2002 | Wolf |
| 7,102,403 B2 | 9/2006 | Wang |
| 7,368,966 B2 | 5/2008 | Hur |
| 7,548,099 B2 | 6/2009 | Arai |
| 7,598,790 B1 | 10/2009 | Esposito et al. |
| 7,605,626 B2 | 10/2009 | Hur |
| 7,746,972 B1 | 6/2010 | Melanson et al. |
| 7,826,582 B2 | 11/2010 | Kuhns et al. |
| 7,830,189 B2 | 11/2010 | Abe |
| 7,847,609 B2 | 12/2010 | Shin |
| 8,264,260 B2 | 9/2012 | Ko et al. |
| 8,482,331 B2 | 7/2013 | Ahn et al. |
| 2005/0264350 A1* | 12/2005 | Lee .................... H03F 3/217 330/10 |
| 2006/0220714 A1 | 10/2006 | Hur |
| 2008/0204099 A1 | 8/2008 | Hur |
| 2010/0039157 A1* | 2/2010 | Kaeriyama ............ G06F 1/08 327/292 |

(Continued)

FOREIGN PATENT DOCUMENTS

| | | |
|---|---|---|
| JP | 2010161432 | 7/2010 |
| KR | 100696957 | 3/2007 |

(Continued)

*Primary Examiner* — Chun Cao

(74) *Attorney, Agent, or Firm* — Onello & Mello, LLP

(57) ABSTRACT

A clock signal generating method includes receiving a duty code that represents a duty of a clock signal, and a period code that represents a period of a clock signal, and normalizing the duty code to the period code to output a normalized duty code. The clock signal generating method further includes controlling a rising timing of a clock signal in response to the period code, and controlling a falling timing of the clock signal in response to the normalized duty code to generate a timing-controlled clock signal.

29 Claims, 9 Drawing Sheets

(56) References Cited

U.S. PATENT DOCUMENTS

| | | |
|---|---|---|
| 2010/0052751 A1 | 3/2010 | Abe |
| 2010/0264968 A1 | 10/2010 | Ko et al. |
| 2011/0291730 A1 | 12/2011 | Ahn et al. |
| 2013/0033294 A1* | 2/2013 | Choi ............... H03K 21/38 327/175 |

FOREIGN PATENT DOCUMENTS

| | | |
|---|---|---|
| KR | 2010028504 | 3/2010 |
| KR | 2010116012 | 10/2010 |
| KR | 2011130134 | 12/2011 |

* cited by examiner

FIG. 3

DUTY=50%

| DCODE | PCODE | A | B | C | D | NDCODE |
|-------|-------|-----|-----|-----|-----|--------|
| 8'h00 | 8'h40 | 8'h80 | 8'h40 | 8'h20 | 8'h10 | 8'h20 |
|       | 8'h80 | 8'h80 | 8'h40 | 8'h40 | 8'h20 | 8'h40 |
|       | 8'hFF | 8'h80 | 8'h40 | 8'h7F | 8'h40 | 8'h80 |

DUTY=100%

| DCODE | PCODE | A | B | C | D | NDCODE |
|---|---|---|---|---|---|---|
| 8'h7F | 8'h40 | 8'hFF | 8'h7F | 8'h20 | 8'h20 | 8'h40 |
| | 8'h80 | 8'hFF | 8'h7F | 8'h40 | 8'h40 | 8'h80 |
| | 8'hFF | 8'hFF | 8'h7F | 8'h7F | 8'h7F | 8'hFF |

8'h80 ⇒ 1
8'h7F ⇒ 1
⋮
8'h40 ⇒ 1/2
8'h20 ⇒ 1/4
8'h10 ⇒ 1/8
8'h00 ⇒ 0

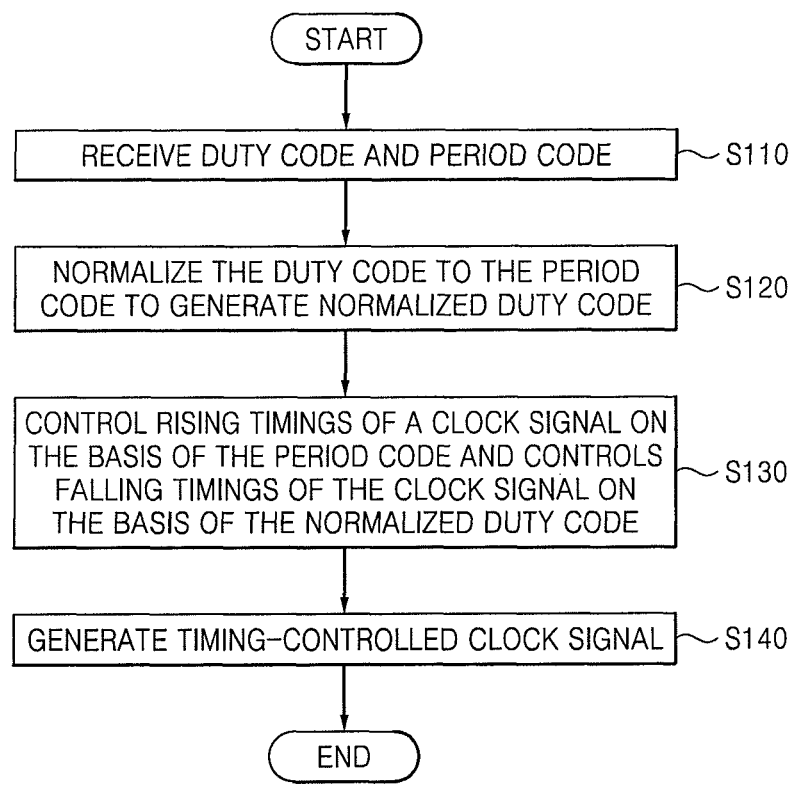

METHODS AND APPARATUS FOR GENERATING CLOCK SIGNALS BASED ON DUTY CODE AND PERIOD CODE

CROSS-REFERENCE TO RELATED APPLICATIONS

This application claims the benefit of Korean Patent Application No. 10-2013-0008895, filed on Jan. 25, 2013, in the Korean Intellectual Property Office, the disclosure of which is incorporated herein in its entirety by reference.

BACKGROUND

Frequency synthesizers are commonly used in digital systems. In electronic circuits, particularly, in synchronous digital systems, frequency synthesizers are used to generate clock signals. Frequency synthesizers typically take the form of phase-locked loop (PLL) and delay-locked loop (DLL) circuits. A PLL includes a voltage controlled oscillator (VCO); however a DLL includes a delay line rather than a VCO.

SUMMARY

Example embodiments relate to clock signal generation technology, and more particularly, to a clock signal generating method, and apparatus employing the method, that are capable of maintaining a constant duty although the clock frequency is changed. To achieve this, in some embodiments, a duty code is normalized to a period code.

According to an aspect of the inventive concept, there is provided a clock signal generating method comprising: receiving a duty code that represents a duty of the clock signal, and a period code that represents a period of the clock signal; and normalizing the duty code to the period code and outputting a normalized duty code.

In some embodiments, the outputting the normalized duty code comprises; changing a most significant bit (MSB) of the duty code to obtain a changed duty code; shifting each of the changed duty code and the period code in a first direction; generating a multiplication code by multiplying the right-shifted changed duty code and the right-shifted period code; and generating the normalized duty code by shifting the multiplication code in a second direction opposite the first direction.

In some embodiments, the method further comprises: controlling a rising timing of a clock signal in response to the period code; controlling a falling timing of the clock signal in response to the normalized duty code; and generating the clock signal having the controlled rising timing and falling timing.

In some embodiments, the falling timing of the clock signal is controlled in response to the period code and the normalized duty code.

In some embodiments, the method further comprises: controlling a rising timing of a clock signal in response to a reference clock signal and the period code; and controlling a falling timing of the clock signal in response to the reference clock signal, the period code, and the normalized duty code to generate a timing-controlled clock signal to generate the clock signal having the controlled rising timing and falling timing.

In some embodiments, the generating the timing-controlled clock signal comprises: frequency-dividing a reference clock signal by a division ratio corresponding to the period code to generate a frequency-divided first clock signal; frequency-dividing the reference clock signal by the division ratio to generate a frequency-divided second clock signal; and receiving the frequency-divided first clock as a set signal and receiving the frequency-divided second clock signal as a reset signal and generating the timing-controlled clock signal having the duty.

In some embodiments, the division ratio is a mixed decimal.

According to an aspect of the inventive concept, there is provided a clock signal generating apparatus comprising a normalized duty code generation circuit that normalizes a signed duty code to an unsigned period code to output a normalized duty code, wherein the signed duty code represents a duty of the clock signal and the unsigned period code represents a period of the clock signal.

In some embodiments, the apparatus further comprises: an oscillator that controls a rising timing of a clock signal in response to the period code and controls a falling timing of the clock signal in response to the normalized duty code to generate a timing-controlled clock signal.

In some embodiments, the oscillator controls the falling timing of the clock signal in response to the period code and the normalized duty code.

In some embodiments, the normalized duty code generation circuit comprises: a most significant bit (MSB) changing circuit that changes an MSB of the duty code; a first shift operator that bitwise shifts an output code of the MSB changing circuit in a first direction; a second shift operator that bitwise shifts the period code in the first direction; a multiplier that multiplies an output code of the first shift operator by an output code of the second shift operator; and a third shift operator that bitwise shifts an output code of the multiplier in a second direction opposite the first direction to generate the normalized duty code.

In some embodiments, the oscillator comprises: a first frequency synthesizer that frequency-divides a reference clock signal by a first mixed decimal corresponding to the period code to generate a frequency-divided first clock signal; a second frequency synthesizer that frequency-divides the reference clock signal by the first mixed decimal to generate a frequency-divided second clock signal; and an SR latch that receives the frequency-divided first clock as a set signal and receives the frequency-divided second clock signal as a reset signal and outputs the timing-controlled clock signal having the duty.

In some embodiments, a difference between respective rising edges of the frequency-divided first clock signal and the frequency-divided second clock signal, which make a pair, is equal to a second mixed decimal corresponding to the normalized duty code.

According to an aspect of the inventive concept, there is provided a power management integrated circuit (PMIC) comprising: a normalized duty code generation circuit that normalizes a duty code to a period code to output a normalized duty code, wherein the duty code represents a duty of a clock signal and the period code represents a period of the clock signal; an oscillator that generates a clock signal that has a rising timing controlled based on the period code and a falling timing controlled based on the normalized duty code; a driver that drives the clock signal to the outside via a first pin; an analog-to-digital converter (ADC) that converts an analogue signal received via a second pin into a digital code; and a duty code generating circuit that generates the duty code on the basis of a reference code and the digital code.

In some embodiments, the duty code is a signed code and wherein the period code is an unsigned code.

In some embodiments, the oscillator controls the falling timing of the clock signal on the basis of the period code and the normalized duty code.

In some embodiments, the normalized duty code generation circuit comprises: a most significant bit (MSB) changing circuit that changes an MSB of the duty code; a first shift operator that bitwise shifts an output code of the MSB changing circuit in a first direction; a second shift operator that bitwise shifts the period code in the first direction; a multiplier that multiplies an output code of the first shift operator by an output code of the second shift operator; and a third shift operator that bitwise shifts an output code of the multiplier in a second direction opposite the first direction to generate the normalized duty code.

In some embodiments, the oscillator comprises: a first frequency synthesizer that frequency-divides a reference clock signal by a first mixed decimal corresponding to the period code to generate a frequency-divided first clock signal; a second frequency synthesizer that frequency-divides the reference clock signal by the first mixed decimal to generate a frequency-divided second clock signal; and an SR latch that receives the frequency-divided first clock as a set signal and receives the frequency-divided second clock signal as a reset signal and outputs the timing-controlled clock signal having the duty.

In some embodiments, a difference between respective rising edges of the frequency-divided first clock signal and the frequency-divided second clock signal, which make a pair, is equal to a second mixed decimal corresponding to the normalized duty code.

According to an aspect of the inventive concept, there is provided a direct current (DC)-DC converter comprising: the PMIC of the type described herein and an inductor connected between the first and second pins.

In some embodiments, the normalized duty code generation circuit comprises: a most significant bit (MSB) changing circuit that changes an MSB of the duty code; a first shift operator that bitwise shifts an output code of the MSB changing circuit in a first direction; a second shift operator that bitwise shifts the period code in the first direction; a multiplier that multiplies an output code of the first shift operator by an output code of the second shift operator; and a third shift operator that bitwise shifts an output code of the multiplier in a second direction opposite the first direction to generate the normalized duty code.

In some embodiments, the oscillator comprises: a first frequency synthesizer that frequency-divides a reference clock signal by a first mixed decimal corresponding to the period code to generate a frequency-divided first clock signal; a second frequency synthesizer that frequency-divides the reference clock signal by the first mixed decimal to generate a frequency-divided second clock signal; and an SR latch that receives the frequency-divided first clock as a set signal and receives the frequency-divided second clock signal as a reset signal and outputs the timing-controlled clock signal having the duty.

According to an aspect of the inventive concept, there is provided a mobile communication device comprising: an application processor; and a PMIC that supplies an operating voltage to the application processor via an inductor connected to a first pin, wherein the PMIC comprises: a normalized duty code generation circuit that normalizes a duty code to a period code to output a normalized duty code, wherein the duty code represents a duty and the period code represents a period; an oscillator that generates a clock signal that has a rising timing controlled based on the period code and a falling timing controlled based on the normalized duty code; a driver that drives the clock signal to the outside via the first pin; an analogue-to-digital converter (ADC) that converts an analogue signal received via a second pin into a digital code; and a duty code generating circuit that generates the duty code on the basis of a reference code output by the application processor and the digital code.

In some embodiments, the oscillator controls the falling timing of the clock signal in response to the period code and the normalized duty code.

In some embodiments, the normalized duty code generation circuit comprises: a most significant bit (MSB) changing circuit that changes an MSB of the duty code; a first shift operator that bitwise shifts an output code of the MSB changing circuit in a first direction; a second shift operator that bitwise shifts the period code in the first direction; a multiplier that multiplies an output code of the first shift operator by an output code of the second shift operator; and a third shift operator that bitwise shifts an output code of the multiplier in a second direction opposite the first direction to generate the normalized duty code.

In some embodiments, the oscillator comprises: a first frequency synthesizer that frequency-divides a reference clock signal by a first mixed decimal corresponding to the period code to generate a frequency-divided first clock signal; a second frequency synthesizer that frequency-divides the reference clock signal by the first mixed decimal to generate a frequency-divided second clock signal; and an SR latch that receives the frequency-divided first clock as a set signal and receives the frequency-divided second clock signal as a reset signal and outputs the timing-controlled clock signal having the duty.

According to an aspect of the inventive concept, there is provided an apparatus comprising; a normalized duty code generator circuit that normalizes a signed duty code to an unsigned period code to output a normalized duty code, wherein the signed duty code represents a duty of a periodic signal and wherein the unsigned period code represents a period of the periodic signal; and a periodic signal generator that generates a periodic signal having the duty and having the period in response to the normalized duty code.

In some embodiments, the periodic signal comprises a clock signal.

In some embodiments, the duty of the periodic signal is maintained as the period is varied.

In some embodiments, a rise timing of the periodic signal is controlled in response to the period code; and a fall timing of the periodic signal is controlled in response to the normalized duty code.

BRIEF DESCRIPTION OF THE DRAWINGS

Exemplary embodiments of the inventive concepts will be more clearly understood from the following detailed description taken in conjunction with the accompanying drawings in which:

FIGS. 3 and 4 are conceptual diagrams for describing a method of normalizing a duty code to a period code;

FIG. 9 is a flowchart of a method of generating a clock signal, according to an embodiment of the present inventive concepts.

DETAILED DESCRIPTION OF EMBODIMENTS

Figure 1:
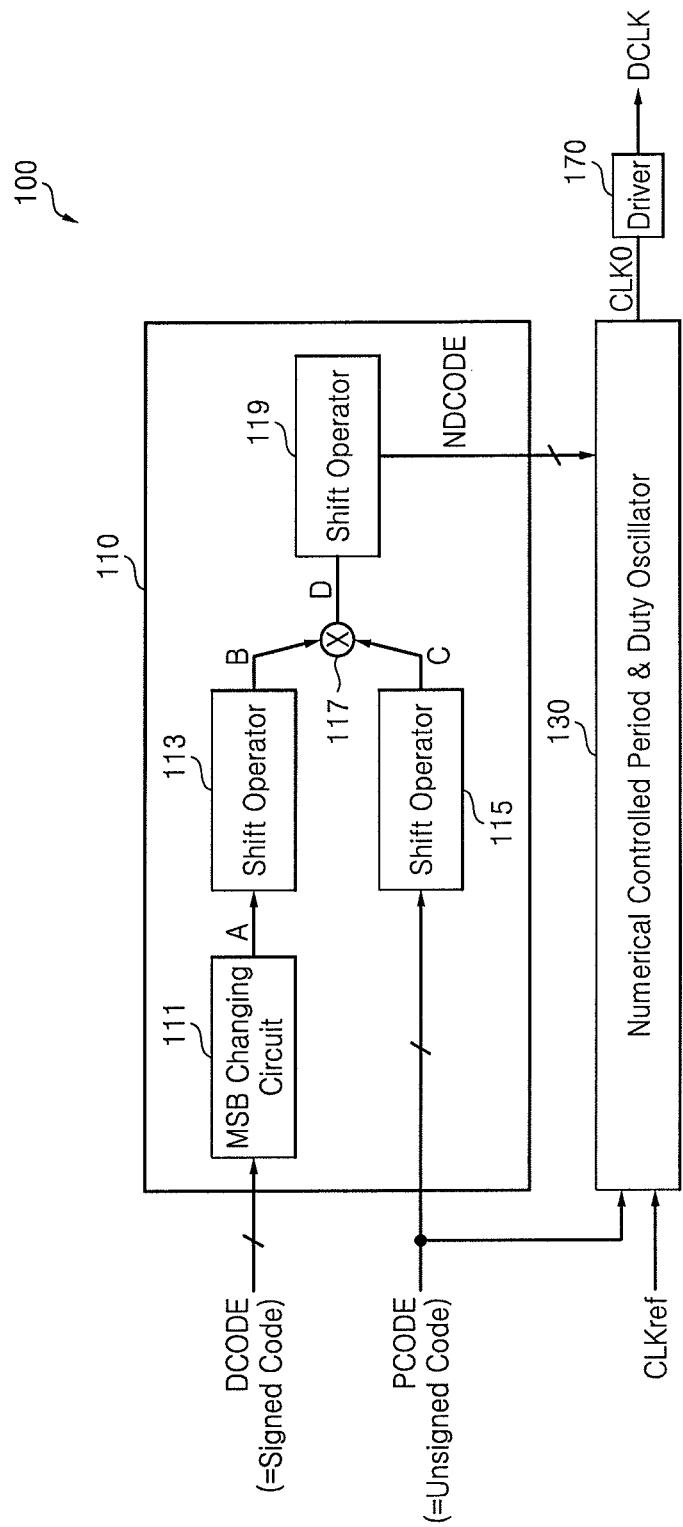
FIG. 1 illustrates a block diagram of a clock signal generation circuit according to an exemplary embodiment of the present inventive concepts.

The inventive concepts now will be described more fully hereinafter with reference to the accompanying drawings, in which embodiments of the inventive concepts are shown. The inventive concepts may, however, be embodied in many different forms and should not be construed as limited to the embodiments set forth herein. Rather, these embodiments are provided so that this disclosure will be thorough and complete, and will fully convey the scope of the inventive concepts to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the inventive concepts. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the inventive concepts belong. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 is a block diagram of a clock signal generation circuit 100 according to an embodiment of the present inventive concepts.

Referring to FIG. 1, the clock signal generation circuit 100 is used as an example of a frequency synthesizer and includes a normalized duty code generation circuit 110, an oscillator 130, and a driver 170. In some embodiments, the clock signal generation circuit 100 may be implemented using an integrated circuit (IC) or a system on chip (SoC) configuration, or other applicable implementation.

The normalized duty code generation circuit 110 normalizes a duty code DCODE, which represents a duty ratio (simply called a duty), to a period code PCODE, which represents a period, to output a normalized duty code NDCODE. The normalized duty code generation circuit 110 may serve as a normalizer.

In some embodiments, the oscillator 130 may be adapted to control a rising timing of a clock signal CLKO in response to states of a reference clock signal CLKref and the period code PCODE, and control a falling timing of the clock signal CLKO in response to states of the reference clock signal CLKref and the normalized duty code NDCODE, thereby generating a timing-controlled clock signal CLKO.

The oscillator 130 may be referred to as a numerical controlled period & duty oscillator. Also, the oscillator 130 may control the timing of the falling of the clock signal CLKO in response to states of the reference clock signal CLKref, the period code PCODE, and the normalized duty code NDCODE.

The driver 170 generates a driving clock signal DCLK in response to the timing-controlled clock signal CLKO. For example, the driver 170 may be implemented by using an inverter or buffer. The clock signal CLKO may be a pulse width modulation (PWM) signal. Thus, the clock signal generation circuit 100 may serve as a PWM signal generation circuit. It should be noted that although the present disclosure refers to the falling timing and rising timing of the clock signal CLK0 in response to the various signals, the reverse may likewise be true; for example the falling of the clock signal CLK0 may be in response to states of a reference clock signal CLKref and the period code PCODE, and the rising of the clock signal CLK0 may be in response to states of the reference clock signal CLKref and the normalized duty code NDCODE.

Figure 2:
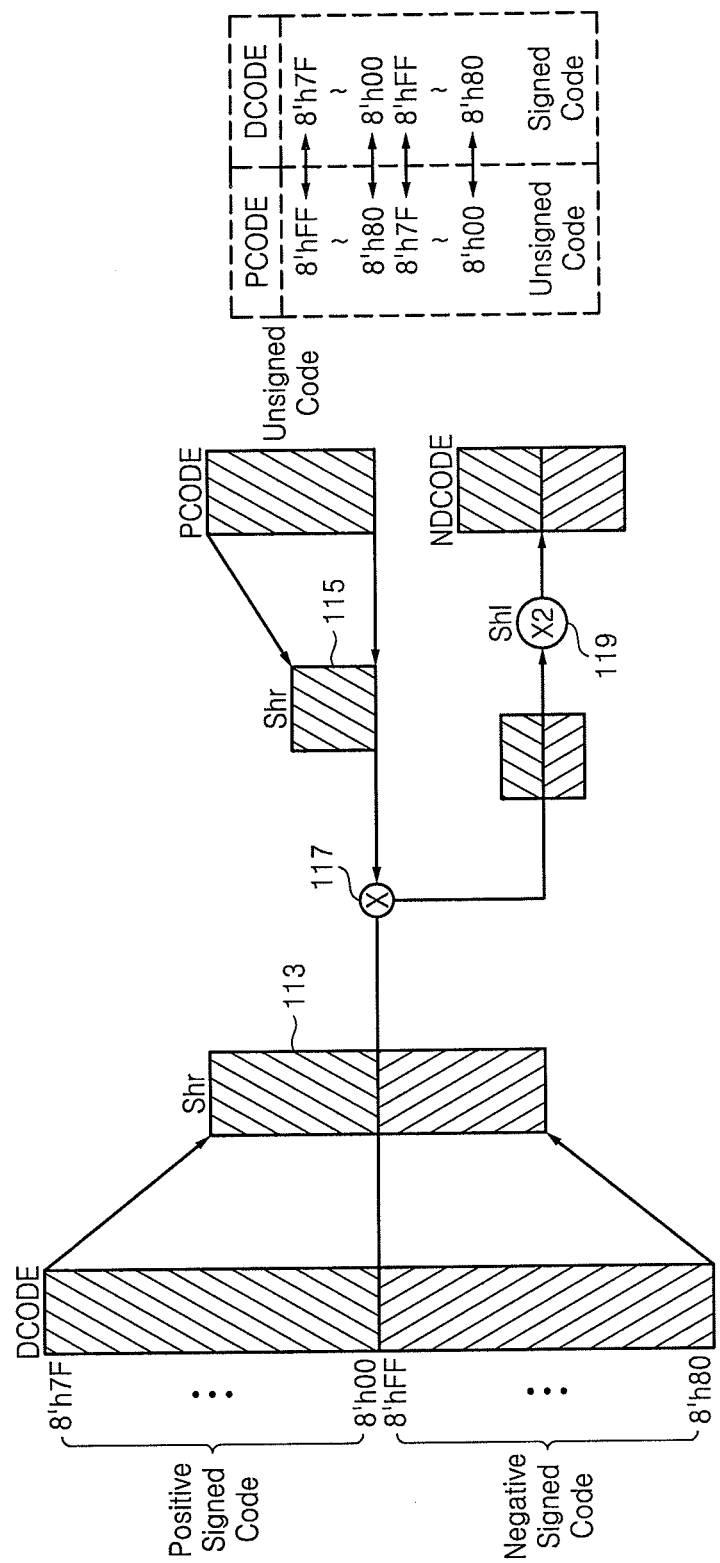
FIG. 2 is a conceptual diagram for describing a method of generating a normalized duty code.

FIG. 2 is a conceptual diagram for describing a method of generating the normalized duty code NDCODE. Referring to FIG. 2, for convenience of explanation, unsigned codes and signed codes are described on the basis of 8 bits. For example, the signed codes denote directional codes based on a specific criterion.

The period code PCODE is an unsigned code and, in the present example embodiment, sequentially increases from 8'h00 to 8'hFF. The unsigned code corresponds to an operating voltage, and the more the unsigned code increases, the more the operating voltage increases.

However, the duty code DCODE is a signed code, and increases from 8'h00 to 8'h7F and decreases from 8'hFF to 8'h80, based on a duty cycle of 50%. In the present illustrative example, the duty is 100% at 8'h7F, and the duty is 0% at 8'h80. For example, a positive signed code may be defined as ranging from 8'h00 to 8'h7F, and a negative signed code may be defined as ranging from 8'hFF to 8'h80.

When the most significant bit (MSB) of an unsigned code is changed, the unsigned code is changed to a signed code. For example, when the unsigned codes of 8'h00, 8'h7F, 8'h80, and 8'hFF are changed to signed codes, they are changed to 8'h80, 8'hFF, 8'h00, and 8'h7F, respectively.

In other words, an MSB changing circuit 111 changes the MSB of the duty code DCODE, for example, from 1 to 0 or from 0 to 1. The MSB changing circuit 111 serves as a code changing circuit which changes a signed code to an unsigned code.

FIGS. 3 and 4 are conceptual diagrams for describing a method of normalizing the duty code DCODE with regard to the period code PCODE. Referring to FIG. 3, the duty code DCODE, that is, 8'h00, represents a duty of 50%.

Referring to FIGS. 1 through 3, when the duty code DCODE is 8'h00, the MSB changing circuit 111 outputs a code A, that is, 8'h80.

A first shift operator 113 outputs a code B, that is, 8'h40, by bitwise shifting the code A (=8'h80) to the right by one bit. When the period code PCODE is 8'h40, a second shift operator 115 outputs a code C, that is, 8'h20, by bitwise shifting the period code PCODE (=8'h40) to the right by one bit.

A multiplier 117 outputs a multiplication code D, that is, 8'h10, by multiplying the output code B (=8'h40) of the first shift operator 113 by the output code C (=8'h20) of the second shift operator 115. At this time, provided that 8'h80 is 1, 8'h40 is ½, and 8'h20 is ¼, and therefore, a product of 8'h40 (=½) and 8'h20 (=¼) is 8'h10 (=⅛).

A third shift operator 119 generates a normalized duty code NDCODE, that is, 8'h20, by bitwise shifting the output code D (=8'h10) of the multiplier 117 to the left by one bit. In other words, a ratio of the normalized duty code NDCODE (=8'h20) to the period code PCODE (=8'h40) is 50%. Each of the first, second, and third shift operators 113, 115, and 119 is implemented by using a bitwise shift register.

As shown in FIG. 3, when the duty code DCODE is 8'h00 representing a duty of 50%, if 8'h40 is input as the period code PCODE, the normalized duty code generation circuit 110 outputs 8'h20 as the normalized duty code NDCODE. On the other hand, if 8'h80 is input as the period code PCODE, the normalized duty code generation circuit 110 outputs 8'h40 as the normalized duty code NDCODE. In this case, a ratio of the normalized duty code NDCODE (=8'h40) to the period code PCODE (=8'h80) is 50%.

Similarly, when 8'hFF is input as the period code PCODE, the normalized duty code generation circuit 110 outputs 8'h80 as the normalized duty code NDCODE. A ratio of the normalized duty code NDCODE (=8'h80) to the period code PCODE (=8'hFF) is almost 50%.

In other words, when the duty code DCODE remains constant, even in a case where the period code PCODE corresponding to an operating voltage is changed, the duty code DCODE is normalized to the period code PCODE. Thus, the normalized duty code generation circuit 110 may reflect a duty corresponding to the duty code DCODE in the changed period code PCODE and may generate the normalized duty code NDCODE according to a result of the normalization.

Referring to FIG. 4, the duty code DCODE, that is, 8'h7F, represents a duty of 100%. Referring to FIGS. 1, 2, and 4, when the duty code DCODE is 8'h7F, the MSB changing circuit 111 outputs a code A, that is, 8'hFF.

The first shift operator 113 outputs a code B, that is, 8'h7F, by bitwise shifting the code A (=8'hFF) to the right by one bit. When the period code PCODE is 8'h40, the second shift operator 115 outputs a code C, that is, 8'h20, by bitwise shifting the period code PCODE (=8'h40) to the right by one bit.

The multiplier 117 may output a code D, that is, 8'h20, by multiplying the output code B (=8'h7F) of the first shift operator 113 by the output code C (=8'h20) of the second shift operator 115. In this case, assuming 8'h80 is 1, 8'h7F is nearly 1 because it is close to 8'h80, and 8'h20 is ¼, and therefore a product of 8'h7F (=1) and 8'h20 (=¼) is 8'h20 (=¼).

The third shift operator 119 generates the normalized duty code NDCODE, that is, 8'h40, by bitwise shifting the output code D (=8'h20) of the multiplier 117 to the left by one bit.

As shown in FIG. 4, when the duty code DCODE is 8'h7F representing a duty of 100%, if 8'h40 is input as the period code PCODE, the normalized duty code generation circuit 110 outputs 8'h40 as the normalized duty code NDCODE. In this case, a ratio of the normalized duty code NDCODE (=8'h40) to the period code PCODE (=8'h40) is 100%.

On the other hand, when 8'h80 is input as the period code PCODE, the normalized duty code generation circuit 110 outputs 8'h80 as the normalized duty code NDCODE. In this case, a ratio of the normalized duty code NDCODE (=8'h80) to the period code PCODE (=8'h80) is 100%.

When 8'hFF is input as the period code PCODE, the normalized duty code generation circuit 110 outputs 8'hFF as the normalized duty code NDCODE. In this case, a ratio of the normalized duty code NDCODE (=8'hFF) to the period code PCODE (=8'hFF) is 100%.

In other words, even in a case where the period code PCODE is changed, the duty code DCODE is normalized to the period code PCODE. Thus, the normalized duty code generation circuit 110 may reflect the duty corresponding to the duty code DCODE to the changed period code PCODE, and may generate the normalized duty code NDCODE according to a result of the normalization.

In accordance with the present inventive concepts, the term "normalizing a duty code to a period code" can be considered to mean that, when the duty code DCODE represents a specific duty (for example, 50% or 100%) as illustrated in FIGS. 3 and 4, the normalized duty code generation circuit 110 generates the normalized duty code NCODE representing the specific duty (for example, 50% or 100%) with respect to the period code PCODE, even though the period code PCODE is changed.

As described above, when a duty is set, the clock signal generation circuit 100 including the normalized duty code generation circuit 110 can generate the clock signal CLKO that always has an identical duty although a frequency (or period) corresponding to an operating voltage is changed. In other words, the duty is synchronized with the frequency.

Figure 5:
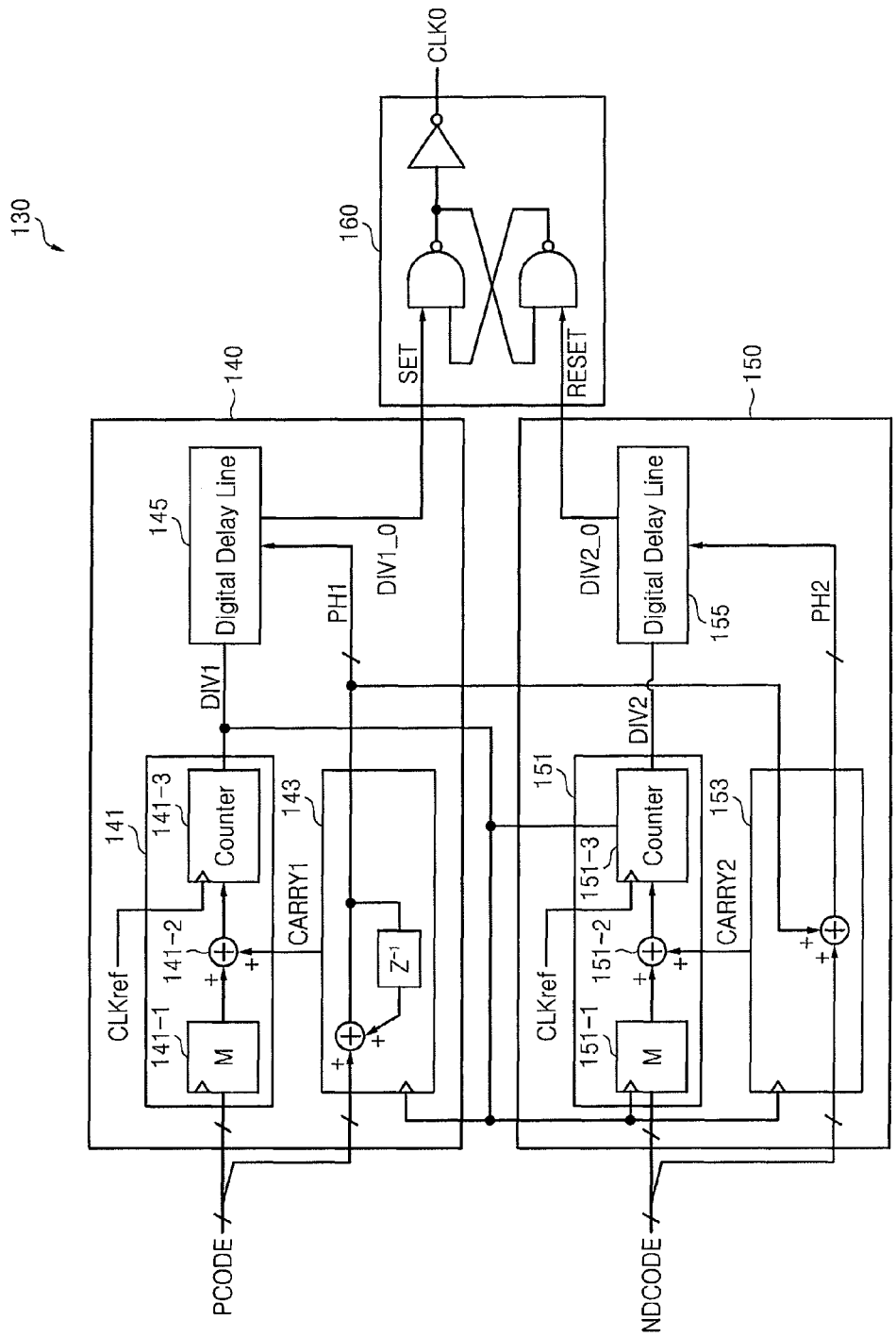
FIG. 5 is a block diagram of an oscillator included in the clock signal generation circuit illustrated in FIG. 1.

FIG. 5 is a block diagram of an embodiment of the oscillator 130 illustrated in FIG. 1. Referring to FIG. 5, the oscillator 130 can include a first frequency synthesizer 140, a second frequency synthesizer 150, and an SR latch 160.

The first frequency synthesizer 140 controls a timing of the rise of the clock signal CLKO in response to states of a reference clock signal CLKref and the period code PCODE. For example, the first frequency synthesizer 140 may include a first integer part 141, a first decimal part 143, and a first digital delay line 145.

The first integer part 141 includes a latch 141-1, which latches an integer part of the period code PCODE in response to an additional clock signal (not shown), a first adder 141-2, which adds an output signal of the latch 141-1 to a first carry CARRY1 output by the first decimal part 143, and a first counter 141-3, which counts an output signal of the first adder 141-2 in response to the reference clock signal CLKref. The first integer part 141 outputs an integer frequency-divided clock signal DIV1.

In response to the integer frequency-divided clock signal DIV1, the first decimal part 143 accumulates a decimal part of the period code PCODE and generates the first carry CARRY1 and a first decimal PH1 according to a result of the accumulation.

The second frequency synthesizer 150 controls the timing of the falling of the clock signal CLKO in response to states of the reference clock signal CLKref and the normalized duty code NDCODE. In more detail, the second frequency synthesizer 150 may control the falling timing of the clock signal CLKO on the basis of the reference clock signal CLKref, the period code PCODE, and the normalized duty code NDCODE.

For example, the second frequency synthesizer 150 may include a second integer part 151, a second decimal part 153, and a second digital delay line 155.

The second integer part 151 includes a latch 151-1, which latches an integer part of the normalized duty code NDCODE in response to the integer frequency-divided clock signal DIV1, a second adder 152-2, which adds an output signal of the latch 151-1 to a second carry CARRY2 output by the second decimal part 153, and a second counter 151-3, which counts an output signal of the second adder 151-2 in response to the reference clock signal CLKref. The second integer part 151 outputs an integer frequency-divided clock signal DIV2.

In response to the integer frequency-divided clock signal DIV1, the second decimal part 153 adds a decimal part of the normalized duty code NDCODE to the first decimal PH1 and generates a second carry CARRY2 and a second decimal PH2 according to a result of the addition.

An operation of each of the first frequency synthesizer 140 and the second frequency synthesizer 150 will be described in detail by referring to FIG. 7.

The SR latch 160 receives as a set signal SET a first clock signal DIV1_O frequency-divided by the first frequency synthesizer 140 and receives as a reset signal RESET a second clock signal DIV2_O frequency-divided by the second frequency synthesizer 150, thereby generating the timing-controlled clock signal CLKO.

FIG. 5 illustrates, as an embodiment of the SR latch 160, an SR latch including cross-coupled NAND gates and an inverter. However, in various embodiments the structure of the SR latch 160 may take other suitable configurations.

Figure 6:
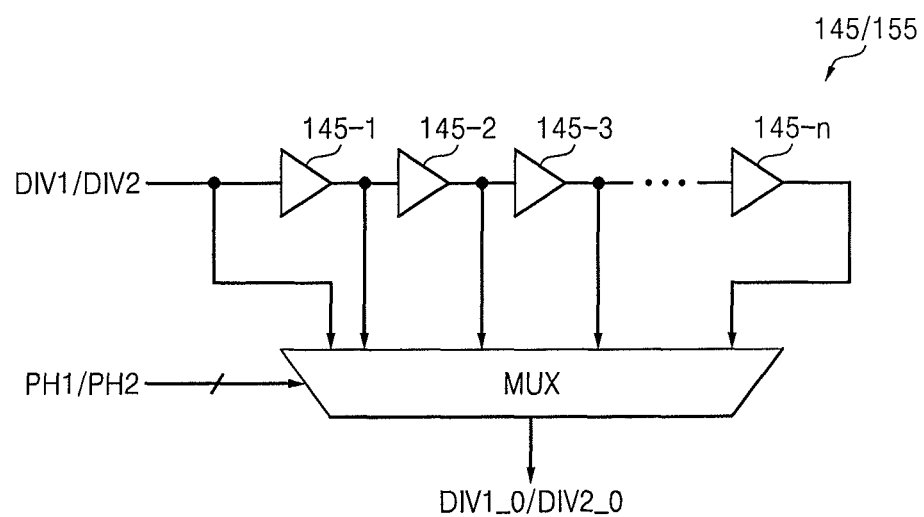
FIG. 6 is a block diagram of digital delay lines included in the oscillator of FIG. 5.

FIG. 6 is a block diagram of each of the first and second digital delay lines 145 and 155 of FIG. 5. Referring to FIG. 6, each of the first and second digital delay lines 145 and 155 includes a plurality of delay units 145-1 through 145-n (where n is a natural number) serially connected to one another, and a multiplexer (MUX).

The delay units 145-1 through 145-n may perform the same delay. Each of the delay units 145-1 through 145-n may delay each of the integer frequency-divided clock signals DIV1 and DIV2 respectively output by the first and second integer parts 141 and 151.

The MUX may selectively output one of an input signal of the delay unit 145-1 and an output signal of each of the delay units 145-1 through 145-n on the basis of a plurality of selection signals output by each of the first and second decimal parts 143 and 153, for example, a plurality of bits representing the first and second decimals PH1 and PH2.

In other words, the first and second digital delay lines 145 and 155 may be configured to control delays of the integer frequency-divided clock signals DIV1 and DIV2, respectively, and may output the frequency-divided first and second clock signals DIV1_O and DIV2_O, respectively.

Figure 7:
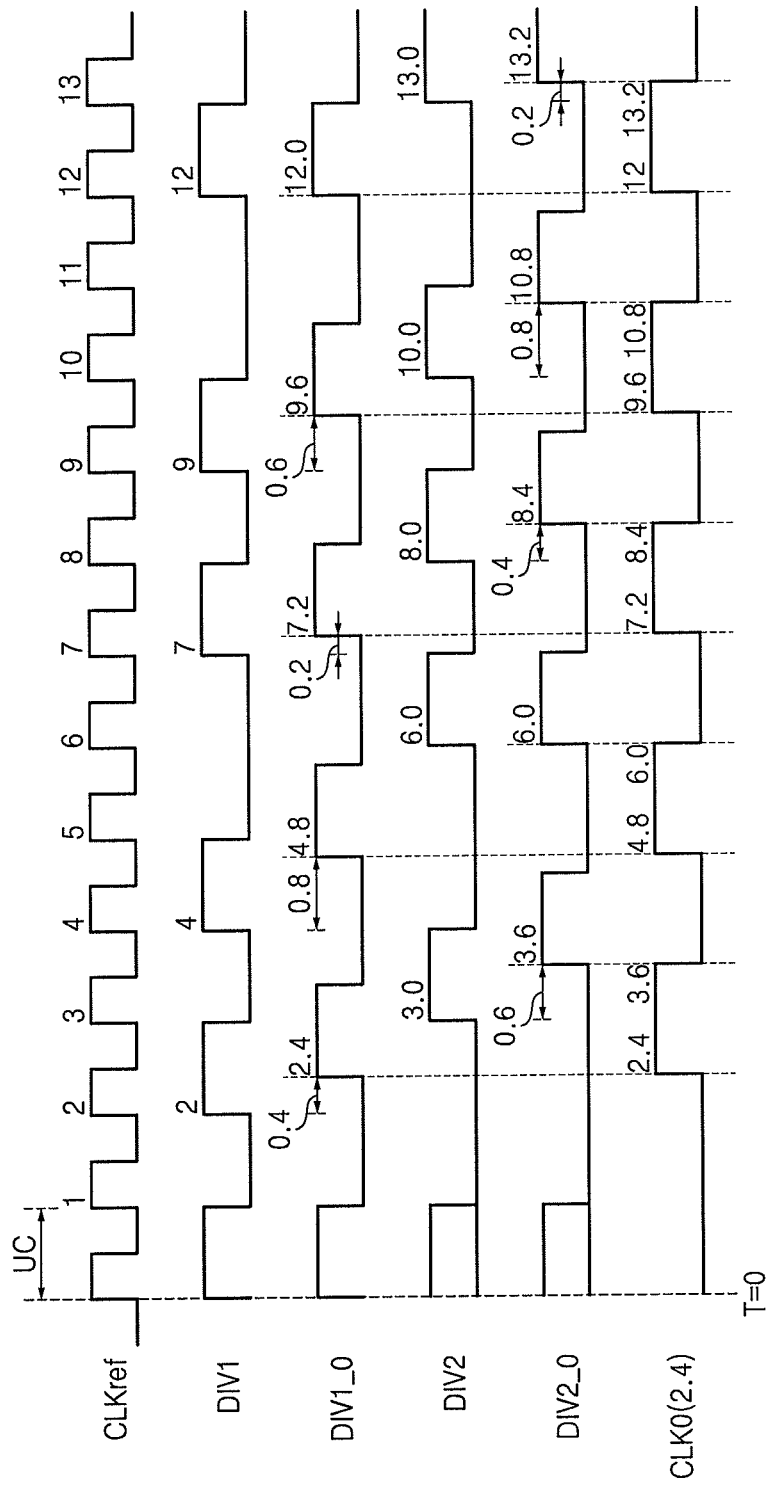
FIG. 7 illustrates wave forms of signals generated by the oscillator of FIG. 5.

FIG. 7 illustrates waveforms of signals generated by the oscillator 130 of FIG. 5. For convenience of explanation, it is assumed that a first mixed decimal corresponding to the period code PCODE is 2.4, and a second mixed decimal corresponding to the normalized duty code NDCODE for a duty of 50% is 1.2.

As shown in FIG. 7, the rise timings of a divide-by-2.4 frequency-divided first clock signal DIV1_O output by the first frequency synthesizer 140 are defined as 2.4, 4.8, 7.2, 9.6, and 12.0, based on a base point T=0.

Rise timings of the clock signal DIV1 output by the first integer part 141 of the first frequency synthesizer 140 are respectively defined as respective integers 2, 4, 7, 9, and 12 of the mixed decimals 2.4, 4.8, 7.2, 9.6, and 12.0. Also, the first digital delay line 145 delays the clock signal DIV1 by respective decimals 0.4, 0.8, 0.2, 0.6, and 0.0 of the mixed decimals 2.4, 4.8, 7.2, 9.6, and 12.0, and then outputs the divide-by-2.4 frequency-divided first clock signal DIV1_O.

Rising timings of a divide-by-2.4 frequency-divided second clock signal DIV2_O output by the second frequency synthesizer 150 are defined as 3.6, 6.0, 8.4, 10.8, and 13.2, based on the base point T=0.

Rising timings of the clock signal DIV2 output by the second integer part 151 of the second frequency synthesizer 150 are respectively defined as respective integers 3, 6, 8, 10, and 13 of the mixed decimals 3.6, 6.0, 8.4, 10.8, and 13.2.

Also, the second digital delay line 155 delays the clock signal DIV2 by respective decimals 0.6, 0.0, 0.4, 0.8, and 0.2 of the mixed decimals 3.6, 6.0, 8.4, 10.8, and 13.2, and then outputs the divide-by-2.4 frequency-divided second clock signal DIV2_O. Here, an integer of each mixed decimal denotes the order of each pulse of the reference clock signal CLKref, and a decimal of each mixed decimal denotes a delay or a delay amount.

The timing that each of the signals DIV1, DIV1_O, DIV2, DIV2_O, and CLK0 (2.4) is generated is explained based on numbers shown in FIG. 7.

At the base point T0, the first frequency synthesizer 140 outputs the divide-by-2.4 frequency-divided first clock signal DIV1_O.

During a first processing section, that is, when the divide-by-2.4 frequency divided first clock signal DIV1_O is output at timing corresponding to 2.4 (simply at 2.4), the first integer part 141 outputs a divide-by-2 frequency-divided clock signal DIV1 at timing corresponding to 2 (simply at 2), and the first decimal part 143 outputs a first decimal PH1 (=0.4). At this time, the first digital delay line 145 delays the divide-by-2 frequency-divided clock signal DIV1 by 0.4 relative to a 1-clock cycle UC and then outputs the divide-by-2.4 frequency divided first clock signal DIV1_O at 2.4.

Since the SR latch 160 receives as the set signal SET the divide-by-2.4 frequency-divided first clock signal DIV1_O output by the first digital delay line 145, the SR latch 160 outputs a clock signal CLKO of which rising timing has been controlled at 2.4.

Thereafter, the second integer part 151 outputs a divide-by-3 frequency-divided clock signal DIV2 at timing corresponding to the integer (that is, 3) of a sum of 2.4 and 1.2, namely, 3.6, and the second decimal part 153 outputs a second decimal PH2 (=0.6). At this time, the second digital delay line 155 delays the divide-by-3 frequency-divided clock signal DIV2 by 0.6 relative to the 1-clock cycle UC and then outputs the divide-by-2.4 frequency-divided second clock signal DIV2_O at 3.6.

Since the SR latch 160 receives as the reset signal RESET the divide-by-2.4 frequency-divided second clock signal DIV2_O output by the second digital delay line 155, the SR latch 160 outputs a clock signal CLKO of which falling timing has been controlled at a time of 3.6.

During a second processing section, that is, when the divide-by-2.4 frequency-divided first clock signal DIV1_O is output at 4.8, the first integer part 141 outputs a divide-by-3 frequency-divided clock signal DIV1 at 4.0 and the first decimal part 143 outputs a first decimal PH1 (=0.8). At this time, the first digital delay line 145 delays a divide-by-2 frequency-divided clock signal DIV1 by 0.8, and then outputs the divide-by-2.4 frequency-divided first clock signal DIV1_O at 4.8.

Since the SR latch 160 receives as a set signal SET the divide-by-2.4 frequency-divided first clock signal DIV1_O output by the first digital delay line 145, the SR latch 160 outputs a clock signal CLKO of which rising timing has been controlled at 4.8.

Thereafter, the second integer part 151 outputs a divide-by-2 frequency-divided clock signal DIV2 at timing corresponding to the integer (that is, 6) of a sum of 4.8 and 1.2, namely, 6.0, and the second decimal part 153 outputs a second decimal PH2 (=0.0). At this time, the second digital delay line 155 delays the divide-by-2 frequency-divided clock signal DIV2 by 0.0, and then outputs the divide-by-2.4 frequency-divided second signal DIV2_O at 6.0.

Since the SR latch 160 receives as a reset signal RESET the divide-by-2.4 frequency-divided second signal DIV2_O output by the second digital delay line 155, the SR latch 160 outputs a clock signal CLKO of which falling timing has been controlled at 6.0

During a third processing section, that is, when the divide-by-2.4 frequency-divided first clock signal DIV1_O is output at 7.2, the first integer part 141 outputs a divide-by-2 frequency-divided clock signal DIV1 at 7 and the first decimal part 143 outputs a first decimal PH1 (=0.2). At this time, the first digital delay line 145 delays the divide-by-2 frequency-divided clock signal DIV1 by 0.2, and then outputs the divide-by-2.4 frequency-divided first signal DIV1_O at 7.2.

Since the SR latch 160 receives as a set signal SET the divide-by-2.4 frequency-divided first signal DIV1_O output by the first digital delay line 145, the SR latch 160 outputs a clock signal CLKO of which rising timing has been controlled at 7.2.

Thereafter, the second integer part 151 outputs a divide-by-2 frequency-divided clock signal DIV2 at timing corresponding to the integer (that is, 8) of a sum of 7.2 and 1.2, namely, 8.4, and the second decimal part 153 outputs a second decimal PH2 (=0.4). At this time, the second digital delay line 155 delays a divide-by-2 frequency-divided clock signal DIV2 by 0.4, and then outputs the divide-by-2.4 frequency-divided second clock signal DIV2_O at 8.4.

Since the SR latch 160 receives as a reset signal RESET the divide-by-2.4 frequency-divided second clock signal DIV2_O output by the second digital delay line 155, the SR latch 160 outputs a clock signal CLKO of which falling timing has been controlled at 8.4.

During a fourth processing section, that is, when the divide-by-2.4 frequency-divided first clock signal DIV1_O is output at 9.6, the first integer part 141 outputs a divide-by-3 frequency-divided clock signal DIV1 at 9 and the first decimal part 143 outputs a first decimal PH1 (=0.6). At this time, the first digital delay line 145 delays the divide-by-3 frequency-divided clock signal DIV1 by 0.6, and then outputs the divide-by-2.4 frequency-divided first signal DIV1_O at 9.6.

Since the SR latch 160 receives as a set signal SET the divide-by-2.4 frequency-divided first clock signal DIV1_O output by the first digital delay line 145, the SR latch 160 outputs a clock signal CLKO of which rising timing has been controlled at 9.6.

Thereafter, the second integer part 151 outputs a divide-by-3 frequency-divided clock signal DIV2 at timing corresponding to the integer (that is, 10) of a sum of 9.6 and 1.2, namely, 10.8, and then the second decimal part 153 outputs a second prime number PH2 (=0.8). At this time, the second digital delay line 155 delays the divide-by-3 frequency-divided first signal clock signal DIV2 by 0.8, and then outputs the divide-by-2.4 frequency-divided first signal second clock signal DIV2_O at 10.8.

Since the SR latch 160 receives as a reset signal RESET the divide-by-2.4 frequency-divided second clock signal DIV2_O output by the second digital delay line 155, the SR latch 160 outputs a clock signal CLKO of which falling timing has been controlled at 10.8.

During a fifth processing section, that is, when the divide-by-2.4 frequency-divided first clock signal DIV1_O is output at 12.0, the first integer part 141 outputs a divide-by-2 frequency-divided clock signal DIV1 at 12 and the first decimal part 143 outputs a first prime number PH1 (=0.0). At this time, the first digital delay line 145 delays the divide-by-2 frequency-divided clock signal DIV1 by 0.0, and then outputs the divide-by-2.4 frequency-divided first clock signal DIV1_O at 12.0.

Since the SR latch 160 receives as a set signal SET the divide-by-2.4 frequency-divided first clock signal DIV1_O output by the first digital delay line 145, the SR latch 160 outputs a clock signal CLKO of which rising timing has been controlled at 12.0.

Thereafter, the second integer part 151 outputs a divide-by-2 frequency-divided clock signal DIV2 at timing corresponding to the integer (that is, 13) of a sum of 12.0 and 1.2, namely, 13.2, and the second decimal part 153 outputs a second prime number PH2 (=0.2). At this time, the second digital delay line 155 delays the divide-by-2 frequency-divided clock signal DIV2 by 0.2, and then outputs the divide-by-2.4 frequency-divided second clock signal DIV2_O at 13.2.

Since the SR latch 160 receives as a reset signal RESET the divide-by-2.4 frequency-divided second clock signal DIV2_O output by the second digital delay line 155, the SR latch 160 outputs a clock signal CLKO of which falling timing has been controlled at 13.2. As shown in FIG. 7, when a period is 2.4, a duty is 50%.

A difference (for example, 1.2) between respective rising edges of the frequency-divided first clock signal DIV1_O and the frequency-divided second clock signal DIV2_0, which make a pair, is equal to the second mixed decimal corresponding to the normalized duty code NDCODE, for example, to 1.2.

Figure 8:
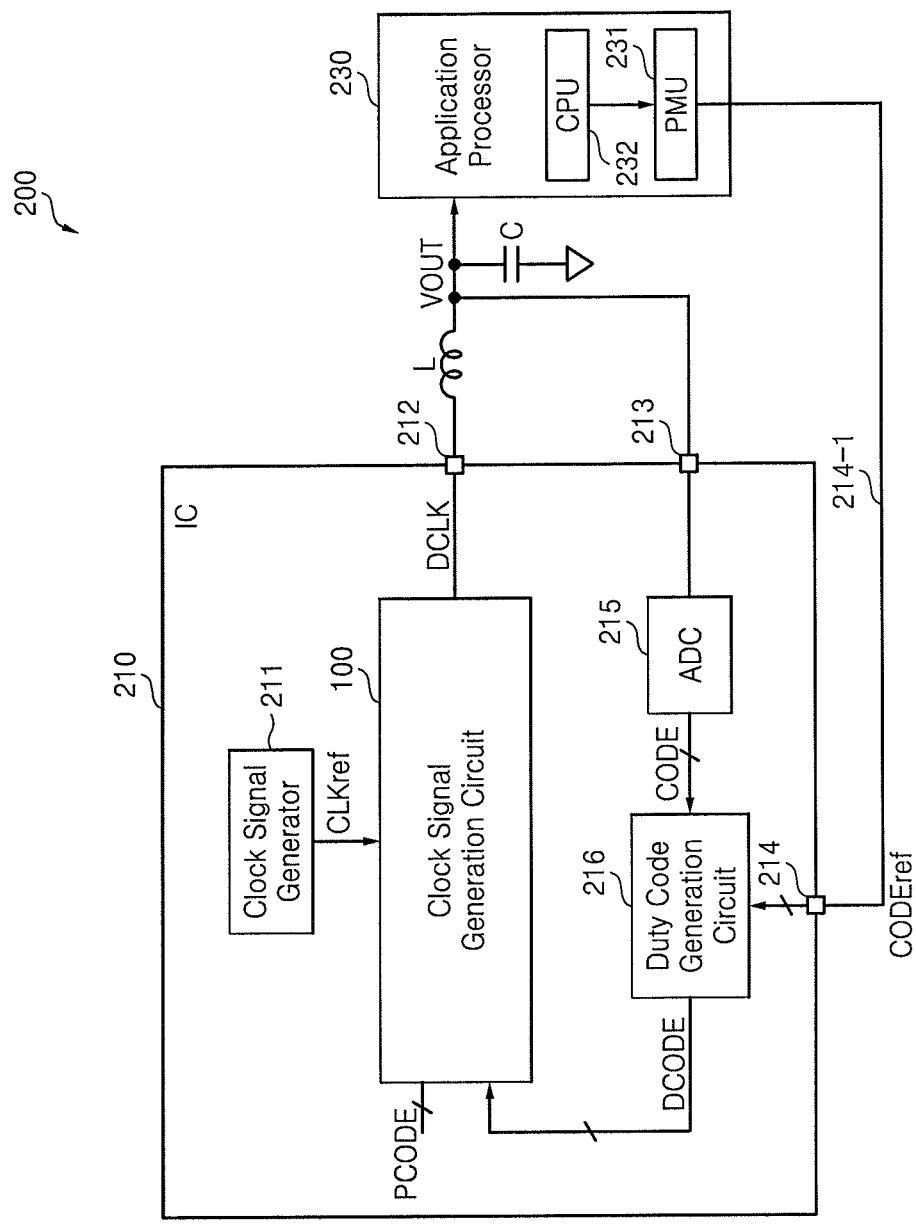
FIG. 8 is a block diagram of a mobile communication device including the clock signal generation circuit according to the embodiment illustrated in FIG. 1.

FIG. 8 is a block diagram of a mobile communication device 200 including the clock signal generation circuit 100 illustrated in FIG. 1. Referring to FIG. 8, the mobile communication device 200 includes a power management integrated circuit (PMIC) 210, an inductor L, and an application processor 230.

The mobile communication device 200 may be implemented by using a laptop computer, a mobile telephone, a smart phone, a tablet PC, a personal digital assistant (PDA), an enterprise digital assistant (EDA), a digital still camera, a digital video camera, a portable multimedia player (PMP), a personal navigation device or portable navigation device (PND), a handheld game console, a mobile internet device (MID), or an e-book, or other suitable circuit configuration.

The PMIC 210 includes the clock signal generation circuit 100, a reference clock signal generator 211, a plurality of pins, namely, first, second, and third pins 212, 213, and 214, an analog-to-digital converter (ADC) 215, and a duty code generation circuit 216.

The PMIC 210 and the inductor L perform a function of a digital-controlled DC-DC converter or a buck converter.

The reference clock signal generator 211 supplies the reference clock signal CLKref to the clock signal generation circuit 100.

The first pin 212 supplies the driving clock signal DCLK output from the driver 170 to the inductor L. The second pin 213 transmits an operating voltage VOUT fed back from the inductor L to the ADC 215. The third pin 213 transmits a reference code CODEref received via a control line 214-1 to the duty code generation circuit 216.

The operating voltage VOUT is supplied to the application processor 230 via the inductor L. A capacitor C may be connected to an output terminal of the inductor L in order to remove ripples of the operating voltage VOUT.

The ADC 215 converts the operating voltage VOUT fed back from the inductor L via the second pin 213, into a digital code CODE.

The duty code generation circuit 216 generates the duty code DCODE in response to the reference code CODEref and the digital code CODE, and then outputs the duty code DCODE to the clock signal generation circuit 100. For example, the duty code generation circuit 216 may generate the duty code DCODE corresponding to a difference, or other relationship, between the reference code CODEref and the digital code CODE.

The application processor 230 receives the operating voltage and includes a power management unit (PMU) 231 and a central processing unit (CPU) 232 for controlling an operation of the PMU 231. The PMU 231 may generate the reference code CODEref under the control of the CPU 232.

FIG. 9 is a flowchart of a method of generating a clock signal, according to an embodiment of the inventive concept. Referring to FIGS. 1 through 9, the clock signal generation circuit 100 receives the duty code DCODE, which represents a duty, and the period code PCODE, which represents a period, in operation S110.

The clock signal generation circuit 100 normalizes the duty code DCODE with respect to the period code PCODE to generate the normalized duty code NDCODE, in operation S120.

The clock signal generation circuit 100 controls rising timings of the clock signal CLKO on the basis of the period code PCODE, and controls falling timings of the clock signal CLKO on the basis of the normalized duty code NDCODE, in operation S130. Accordingly, the clock signal generation circuit 100 generates the timing-controlled clock signal CLKO, in operation S140.

According to embodiments of the present inventive concepts, the clock signal generation circuit 100 may control the rise and fall timings of the clock signal CLKO on the basis of the period code PCODE and the normalized duty code NDCODE.

In a method and an apparatus according to an embodiment of the present inventive concepts, a constant duty may be maintained in the resulting clock signal, even in cases where the period code has been changed, by normalizing the duty code to the period code.

While the inventive concepts have been particularly shown and described with reference to exemplary embodiments thereof, it will be understood that various changes in form and details may be made herein without departing from the spirit and scope of the following claims.

What is claimed is:

1. A clock signal generating method comprising:
   receiving, at a normalized duty code generation circuit, a duty code that represents a duty of a clock signal, and a period code that represents a period of the clock signal;
   generating a frequency-divided clock based on a reference clock signal;
   controlling at least one of a rising timing and a falling timing of the clock signal by delaying the frequency-divided clock through a delay line; and
   generating the clock signal having the duty and the period based on the duty code and the period code.

2. The method of claim 1, further comprising normalizing the duty code with respect to the period code and outputting the normalized duty code, wherein the outputting the normalized duty code comprises;
   changing a most significant bit (MSB) of the duty code to obtain a changed duty code;
   shifting each of the changed duty code and the period code in a first direction;
   generating a multiplication code by multiplying the right-shifted changed duty code and the right-shifted period code; and
   generating the normalized duty code by shifting the multiplication code in a second direction opposite the first direction.

3. The method of claim 2, further comprising:
   controlling a rising timing of the clock signal in response to the period code; and
   controlling a falling timing of the clock signal in response to the normalized duty code; and
   generating the clock signal having the controlled rising timing and falling timing.

4. The method of claim 3, wherein the falling timing of the clock signal is controlled in response to the period code and the normalized duty code.

5. The method of claim 2, further comprising:
   controlling a rising timing of the clock signal in response to the reference clock signal and the period code; and
   controlling a falling timing of the clock signal in response to the reference clock signal, the period code, and the normalized duty code to generate a timing-controlled clock signal to generate the clock signal having the controlled rising timing and falling timing.

6. The method of claim 3, wherein the generating the timing-controlled clock signal comprises:
   frequency-dividing the reference clock signal by a division ratio corresponding to the period code to generate a frequency-divided first clock signal;
   frequency-dividing the reference clock signal by the division ratio to generate a frequency-divided second clock signal; and
   receiving the frequency-divided first clock as a set signal and receiving the frequency-divided second clock signal as a reset signal and generating the timing-controlled clock signal having the duty.

7. The method of claim 6, wherein the division ratio is a mixed decimal.

8. A power management integrated circuit (PMIC) comprising:
   a reference clock signal generator that generates a reference clock; and
   an oscillator that includes a delay line to delay a frequency-divided clock signal based on the reference clock and that generates a clock signal that has a rising timing and a falling timing based on the frequency-divided clock signal, a period code and a duty code,
   wherein the duty code represents a duty of the clock signal and the period code represents a period of the clock.

9. The PMIC of claim 8, further comprising the oscillator that controls the rising timing of the clock signal in response to the period code and controls the falling timing of the clock signal in response to a normalized duty code that normalizes the duty code with respect to the period code.

10. The PMIC of claim 9, wherein the oscillator controls the falling timing of the clock signal in response to the period code and the normalized duty code.

11. The PMIC of claim 8, further comprising a normalized duty code generation circuit that normalizes a signed duty code with respect to an unsigned period code to output a normalized duty code, wherein the signed duty code represents the duty of the clock signal and the unsigned period code represents the period of the clock signal,
wherein the normalized duty code generation circuit comprises:
a most significant bit (MSB) changing circuit that changes an MSB of the duty code;
a first shift operator that bitwise shifts an output code of the MSB changing circuit in a first direction;
a second shift operator that bitwise shifts the period code in the first direction;
a multiplier that multiplies an output code of the first shift operator by an output code of the second shift operator; and
a third shift operator that bitwise shifts an output code of the multiplier in a second direction opposite the first direction to generate the normalized duty code.

12. The PMIC of claim 8, wherein the oscillator comprises:
a first frequency synthesizer that frequency-divides the reference clock signal by a first mixed decimal corresponding to the period code to generate a frequency-divided first clock signal;
a second frequency synthesizer that frequency-divides the reference clock signal by the first mixed decimal to generate a frequency-divided second clock signal; and
an SR latch that receives the frequency-divided first clock as a set signal and receives the frequency-divided second clock signal as a reset signal and outputs the timing-controlled clock signal having the duty.

13. The PMIC of claim 12, wherein a difference between respective rising edges of the frequency-divided first clock signal and the frequency-divided second clock signal, which make a pair, is equal to a second mixed decimal corresponding to the normalized duty code.

14. A power management integrated circuit (PMIC) comprising:
a normalized duty code generation circuit that normalizes a duty code with respect to a period code to output a normalized duty code, wherein the duty code represents a duty of a clock signal and the period code represents a period of the clock signal;
an oscillator that generates a clock signal that has a rising timing controlled based on the period code and a falling timing controlled based on the normalized duty code;
a driver that drives the clock signal to the outside via a first pin;
an analog-to-digital converter (ADC) that converts an analogue signal received via a second pin into a digital code; and
a duty code generating circuit that generates the duty code on the basis of a reference code and the digital code.

15. The PMIC of claim 14 wherein the duty code is a signed code and wherein the period code is an unsigned code.

16. The PMIC of claim 14, wherein the oscillator controls the falling timing of the clock signal on the basis of the period code and the normalized duty code.

17. The PMIC of claim 14, wherein the normalized duty code generation circuit comprises:
a most significant bit (MSB) changing circuit that changes an MSB of the duty code;
a first shift operator that bitwise shifts an output code of the MSB changing circuit in a first direction;
a second shift operator that bitwise shifts the period code in the first direction;
a multiplier that multiplies an output code of the first shift operator by an output code of the second shift operator; and
a third shift operator that bitwise shifts an output code of the multiplier in a second direction opposite the firs direction to generate the normalized duty code.

18. The PMIC of claim 14, wherein the oscillator comprises:
a first frequency synthesizer that frequency-divides a reference clock signal by a first mixed decimal corresponding to the period code to generate a frequency-divided first clock signal;
a second frequency synthesizer that frequency-divides the reference clock signal by the first mixed decimal to generate a frequency-divided second clock signal; and
an SR latch that receives the frequency-divided first clock as a set signal and receives the frequency-divided second clock signal as a reset signal and outputs the timing-controlled clock signal having the duty.

19. The PMIC of claim 18, wherein a difference between respective rising edges of the frequency-divided first clock signal and the frequency-divided second clock signal, which make a pair, is equal to a second mixed decimal corresponding to the normalized duty code.

20. A direct current (DC)-DC converter comprising:
the PMIC of claim 14; and
an inductor connected between the first and second pins.

21. The DC-DC converter of claim 20, wherein the normalized duty code generation circuit comprises:
a most significant bit (MSB) changing circuit that changes an MSB of the duty code;
a first shift operator that bitwise shifts an output code of the MSB changing circuit in a first direction;
a second shift operator that bitwise shifts the period code in the first direction;
a multiplier that multiplies an output code of the first shift operator by an output code of the second shift operator; and
a third shift operator that bitwise shifts an output code of the multiplier in a second direction opposite the first direction to generate the normalized duty code.

22. The DC-DC converter of claim 20, wherein the oscillator comprises:
a first frequency synthesizer that frequency-divides a reference clock signal by a first mixed decimal corresponding to the period code to generate a frequency-divided first clock signal;
a second frequency synthesizer that frequency-divides the reference clock signal by the first mixed decimal to generate a frequency-divided second clock signal; and
an SR latch that receives the frequency-divided first clock as a set signal and receives the frequency-divided second clock signal as a reset signal and outputs the timing-controlled clock signal having the duty.

23. A mobile communication device comprising:
an application processor; and
a PMIC that supplies an operating voltage to the application processor via an inductor connected to a first pin, wherein the PMIC comprises:
- a normalized duty code generation circuit that normalizes a duty code with respect to a period code to output a normalized duty code, wherein the duty code represents a duty and the period code represents a period;
- an oscillator that generates a clock signal that has a rising timing controlled based on the period code and a falling timing controlled based on the normalized duty code;
- a driver that drives the clock signal to the outside via the first pin;
- an analog-to-digital converter (ADC) that converts an analogue signal received via a second pin into a digital code; and
- a duty code generating circuit that generates the duty code on the basis of a reference code output by the application processor and the digital code.

24. The mobile communication device of claim 23, wherein the oscillator controls the falling timing of the clock signal in response to the period code and the normalized duty code.

25. The mobile communication device of claim 23, wherein the normalized duty code generation circuit comprises:
- a most significant bit (MSB) changing circuit that changes an MSB of the duty code;
- a first shift operator that bitwise shifts an output code of the MSB changing circuit in a first direction;
- a second shift operator that bitwise shifts the period code in the first direction;
- a multiplier that multiplies an output code of the first shift operator by an output code of the second shift operator; and
- a third shift operator that bitwise shifts an output code of the multiplier in a second direction opposite the first direction to generate the normalized duty code.

26. The mobile communication device of claim 23, wherein the oscillator comprises:
- a first frequency synthesizer that frequency-divides a reference clock signal by a first mixed decimal corresponding to the period code to generate a frequency-divided first clock signal;
- a second frequency synthesizer that frequency-divides the reference clock signal by the first mixed decimal to generate a frequency-divided second clock signal; and
- an SR latch that receives the frequency-divided first clock as a set signal and receives the frequency-divided second clock signal as a reset signal and outputs the timing-controlled clock signal having the duty.

27. A mobile communication device comprising:
an application processor; and
a PMIC that supplies an operating voltage to the application processor via an inductor connected to a first pin, wherein the PMIC comprises:
- an analog-to-digital converter (ADC) that converts an analogue signal received via a second pin into a digital code;
- a duty code generating circuit that generates a duty code on the basis of a reference code output by the application processor and the digital code;
- a reference clock signal generator that generates a reference clock; and
- an oscillator that includes a delay line to delay a frequency-divided clock signal based on the reference clock and that generates a clock signal that has a rising timing and a falling timing based on the frequency-divided clock signal, the duty code and a period code that represents a period of the signal.

28. The mobile communication device of claim 27, wherein a duty of the clock signal is maintained as the period is varied.

29. The mobile communication device of claim 27, wherein:
the rise timing of the clock signal is controlled in response to the period code; and
the fall timing of the clock signal is controlled in response to a normalized duty code that normalizes the duty code with respect to the period code.

* * * * *